United States Patent
Tan et al.

(10) Patent No.: US 8,521,945 B2
(45) Date of Patent: Aug. 27, 2013

(54) PORTABLE DATA STORAGE USING SLC AND MLC FLASH MEMORY

(75) Inventors: Henry Tan, Loyang Industrial Estate (SG); Teng Pin Poo, Loyang Industrial Estate (SG); Chin Shyan Raymond Ooi, Loyang Industrial Estate (SG)

(73) Assignee: Trek 2000 International Ltd., Loyang Industrial Estate (SG)

( * ) Notice: Subject to any disclaimer, the term of this patent is extended or adjusted under 35 U.S.C. 154(b) by 893 days.

(21) Appl. No.: 11/992,546

(22) PCT Filed: Sep. 29, 2005

(86) PCT No.: PCT/SG2005/000328
§ 371 (c)(1),
(2), (4) Date: May 8, 2008

(87) PCT Pub. No.: WO2007/037757
PCT Pub. Date: Apr. 5, 2007

(65) Prior Publication Data
US 2008/0215801 A1    Sep. 4, 2008

(51) Int. Cl.
*G06F 12/00* (2006.01)
*G06F 13/00* (2006.01)
*G06F 13/28* (2006.01)

(52) U.S. Cl.
USPC .................................. 711/103; 711/E12.008

(58) Field of Classification Search
USPC ........................................................ 711/103
See application file for complete search history.

(56) References Cited

U.S. PATENT DOCUMENTS

| | | | |
|---|---|---|---|
| 5,541,886 A | 7/1996 | Hasbun | |
| 5,671,388 A | 9/1997 | Hasbun | |
| 5,930,167 A | 7/1999 | Lee et al. | |
| 5,966,326 A | 10/1999 | Park et al. | |
| 6,240,040 B1 | 5/2001 | Akaogi et al. | |
| 6,353,553 B1 | 3/2002 | Tamada et al. | |
| 6,728,133 B2 | 4/2004 | Shimizu et al. | |
| 2002/0133765 A1* | 9/2002 | Antosh et al. | 714/718 |
| 2003/0112692 A1 | 6/2003 | Gonzalez et al. | |
| 2005/0223158 A1* | 10/2005 | See et al. | 711/103 |
| 2006/0209596 A1* | 9/2006 | Li | 365/185.17 |
| 2006/0218359 A1* | 9/2006 | Sanders et al. | 711/154 |
| 2008/0052451 A1* | 2/2008 | Pua et al. | 711/103 |
| 2008/0071978 A1* | 3/2008 | Chow et al. | 711/103 |
| 2009/0080252 A1* | 3/2009 | Mitani et al. | 365/185.03 |
| 2010/0023800 A1* | 1/2010 | Harari et al. | 714/2 |

FOREIGN PATENT DOCUMENTS

| | | |
|---|---|---|
| WO | WO-01/63614 A1 | 8/2001 |
| WO | WO-2005/031751 | 4/2005 |

* cited by examiner

*Primary Examiner* — Sheng-Jen Tsai
(74) *Attorney, Agent, or Firm* — Birch, Steart, Kolasch & Birch, LLP

(57) ABSTRACT

A portable data storage device is disclosed that includes an interface (3) for enabling the portable data storage device to be used for data transfer with a host computer (5), and an interface controller (2) for controlling the interface (3). There is also a master controller (7) for controlling the writing of data to and reading of data from a non-volatile memory (8, 9). The non-volatile memory is at least one single level cell (SLC) flash memory (8) and at least one multiple level cell (MLC) flash memory (9). The at least one single level cell flash memory (8) and at least one multiple level cell flash memory (9) are able to operate simultaneously for improving the speed of operation over only multiple level cell flash memory.

12 Claims, 3 Drawing Sheets

PORTABLE DATA STORAGE USING SLC AND MLC FLASH MEMORY

REFERENCE TO RELATED PATENT

Reference is made to our earlier Singapore patent 87,504 dated 21 Feb. 2000 for an invention entitled "A Portable Data Storage Device" (the "earlier patent") the contents of which are hereby incorporated by reference as if disclosed herein.

FIELD OF THE INVENTION

The present invention relates to portable data storage using single layer cell ("SLC") and multiple layer cell ("MLC") flash memory and refers particularly, though not exclusively, to data storage with the simultaneous use of SLC and MLC flash memories to improve the speed of operation.

BACKGROUND TO THE INVENTION

Recently there has been much interest in providing data storage devices containing flash memory and which can be connected to a serial bus of a computer. Such devices are used for data storage, data transfer, media players such as, for example, MP3 players, and so forth. The structure and operation of such a portable storage device may be as shown in the earlier patent. Tradition flash memory is the SLC flash memory. The newer, MLC flash memory has a read and write speed that is much slower than SLC flash memory. Many devices are now including MLC flash memory but the operation of such devices is slower than if only SLC memory was used.

SUMMARY OF THE INVENTION

In accordance with a first preferred aspect there is provided a portable data storage device comprising an interface for enabling the portable data storage device to be used for data transfer with a host computer, and an interface controller for controlling the interface. A master controller is provided for controlling the writing of data to and reading data from a non-volatile memory. The non-volatile memory comprises at least one single layer cell flash memory and at least one multiple layer cell flash memory. The at least one single layer cell flash memory and at least one multiple layer cell flash memory are able to operate simultaneously for improving the speed of operation over only MLC flash memory.

According to a second preferred aspect there is provided a method of processing data on a portable data storage device, the portable data storage device comprising a master controller for controlling a memory, the memory comprising at least one single layer cell flash memory and at least one multiple layer cell flash memory. The method includes using the master controller to control the writing of data to and reading data from a non-volatile memory such that the at least one single layer cell flash memory and at least one multiple layer cell flash memory have data written to and read from them simultaneously.

The may also be at least one data bus operatively connected to the master controller and the at least one single layer cell flash memory and at least one multiple layer cell flash memory for writing data to and reading data from the at least one single layer cell flash memory and at least one multiple layer cell flash memory.

The at least one data bus may be a common data bus for both the at least one single layer cell flash memory and at least one multiple layer cell flash memory. Alternatively, it may be a first data bus operatively connected to the at least one single layer cell flash memory and a second bus operatively connected to the at least one multiple layer cell flash memory. The first data bus may be one of: an upper data bus and a lower data bus, the second data bus being the other of the upper data bus and the lower data bus.

In the first case, the master controller may be for writing data to and reading from the at least one single layer cell flash memory and the at least one multiple layer cell flash memory alternately, the data being in the form of blocks; data being written to and read from the at least one single layer cell flash memory in blocks or pages at a speed that is a multiplication factor higher than those of the at least one multiple layer cell flash memory.

In the second case the master controller may be for writing data to and reading data from the at least one single layer cell flash memory and the at least one multiple layer cell flash memory simultaneously, the data being in a form selected from the group consisting of: blocks, and page. The data may be written to and read from the at least one single layer cell flash memory at a speed a multiplication factor higher than that of the at least one multiple layer cell flash memory.

The multiplication factor may be in the range 5 to 10. Each block of data for the at least one single layer cell flash memory may be 64 pages; and each block of data for the at least one multiple layer cell flash memory may be 128 pages; each page being 2048 bytes.

BRIEF DESCRIPTION OF THE DRAWINGS

In order that the invention may be fully understood and readily put into practical effect, there shall now be described by way of non-limitative example only preferred embodiments of the invention, the description being with reference to the accompanying illustrative drawings.

In the drawings.

DETAILED DESCRIPTION OF THE PREFERRED EMBODIMENTS

Figure 1:
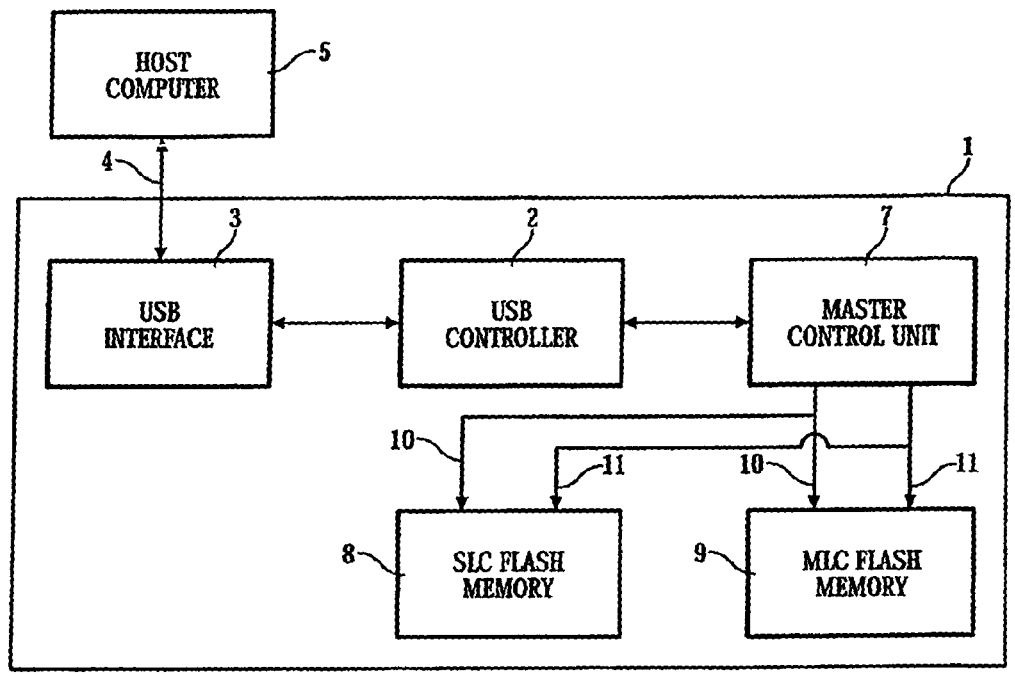
FIG. 1 is a block diagram illustrating the structure of a first embodiment.

In FIG. 1, the portable storage device is within a housing 1. It includes a USB controller 2 which controls a USB interface 3 which connects directly to the serial bus 4 via a USB socket (not shown) of a host computer 5. Data transferred to the USB interface 3 from the host computer 5 passes through the USB controller 2 to a master control unit 7. Data packets are normally of a size that is a multiple of 512 bytes.

The master control unit 7 passes the data packets via a data bus 11 (normally an 8-bit bus) that is common to single layer cell ("SLC") flash memory 8 and multiple layer cell ("MLC") flash memory 9. Command symbols are passed over one or more lines 10 that may be common to the SLC memory 8 and MLC memory 9, as shown. The command symbols passed over lines 10 will normally be ENABLE, ALE, WRITE and READ signals to control both SLC flash memory 8 and MLC flash memory 9.

The ENABLE signal is not sent to both of the memories 8, 9 simultaneously, especially when master control unit 7 is to write data to memory 8, 9, as it enables only one of the memories 8, 9. Enabling is by sending an ENABLE signal to the relevant memory 8 or 9. An ALE signal and WRITE signal are then sent to the respective enabled memory 8 or 9. Master control unit 7 then writes the address data and the data to be stored to the enabled memory 8 or 9 via bus 11.

Only the one of the memories 8 or 9 which is enabled stores the data in the location indicated by address data.

Similarly, when the master control unit 7 is to read data, it enables only one of the memories 8, 9 by using lines 10 to send an ENABLE signal, the ALE signal and READ signal, and the address data using the bus 11.

As the SLC flash memory 8 and MLC flash memory 9 share the same data bus 11, each of the memories 8, 9 has an identical address mapping table which stores the physical address and logical address of the data.

Figure 2:
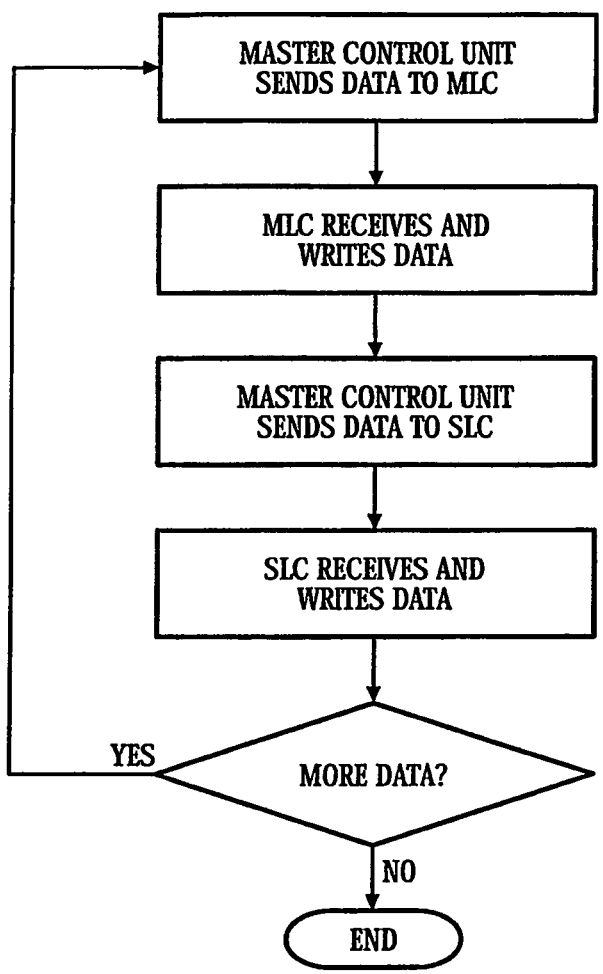
FIG. 2 is a flow chart for the operation of the first embodiment.

As shown in FIG. 2, the master control unit 7 performs READ and WRITE operations on data block basis, and switches between SLC memory 8 and MLC memory 9 by use of control signals via the control signal line 10. For example, during a WRITE operation, the master control unit 7 sends an ENABLE signal to SLC memory 8 over line 10 and then sends a block of data to the SLC memory 8 over bus 11. The master control unit 7 then sends an ENABLE signal to MLC memory 9 over line 10 then sends a block of data to the MLC memory 9 over bus 11. This process will be repeated until the WRITE operation is finished. The address mapping table for the SLC memory 8 and MLC memory 9 will be updated during each WRITE operation.

Substantially the same procedure will be followed during a READ operation when the master control unit 7 sends an ENABLE signal to each of the memories 8, 9 in turn and in response receives a page of data from the respective memory 8, 9. But the address mapping table will not be updated during a READ operation.

A page of data consists of 2048 bytes. A block of data in SLC memory 8 consists of 64 pages and a block of data in MLC memory 9 consists of 128 pages.

Also, SLC memory 8 has a faster writing (and reading) speed than MLC memory 9—normally five to ten times faster. Therefore, the master control unit 7 transmits data to the memories 8, 9 depending on the writing speed of the relevant memory 8, 9. For example, if the SLC memory 8 is five times faster than MLC memory 9, in each data transmission the master control unit 7 transmits five times more data to the SLC memory 8 than to the MLC memory 9. In consequence, both memories are able to operate simultaneously even though they are receiving data sequentially. This is due to the different WRITE (and READ) speeds. In this way the amount of data written to each of the memories 8, 9 at each stage of the WRITE cycle is the maximum data it can process in the same time as the other of the memories 8, 9. In that way the WRITE operation is performed at maximum speed, and with minimal delay. It is similar for READ operations.

Figure 3:
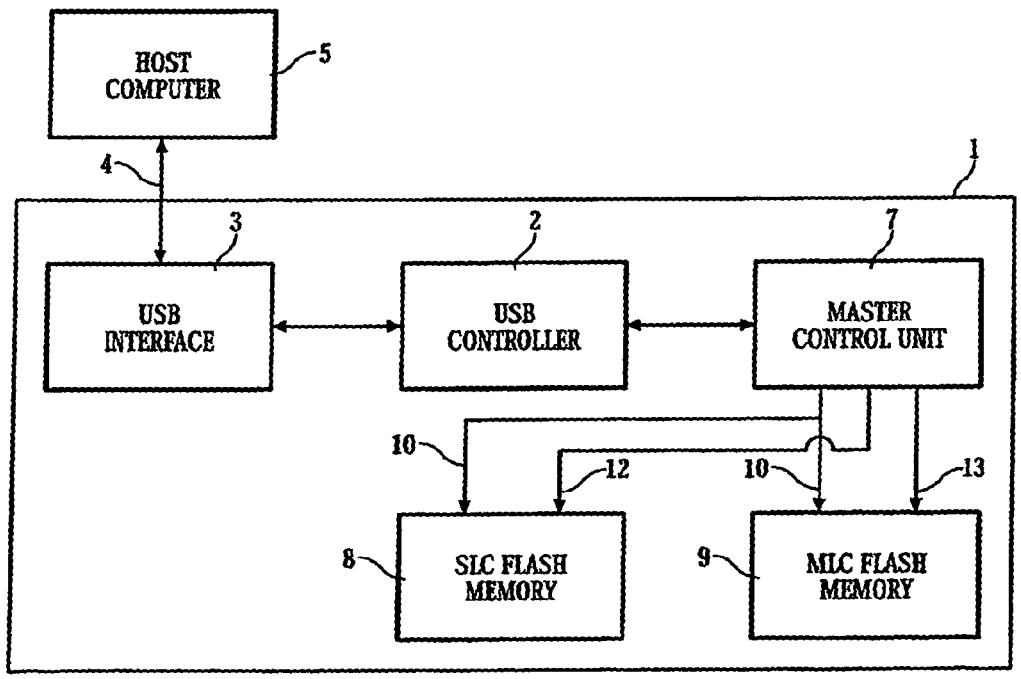
FIG. 3 is a block diagram illustrating the structure of a second embodiment.
Figure 4:
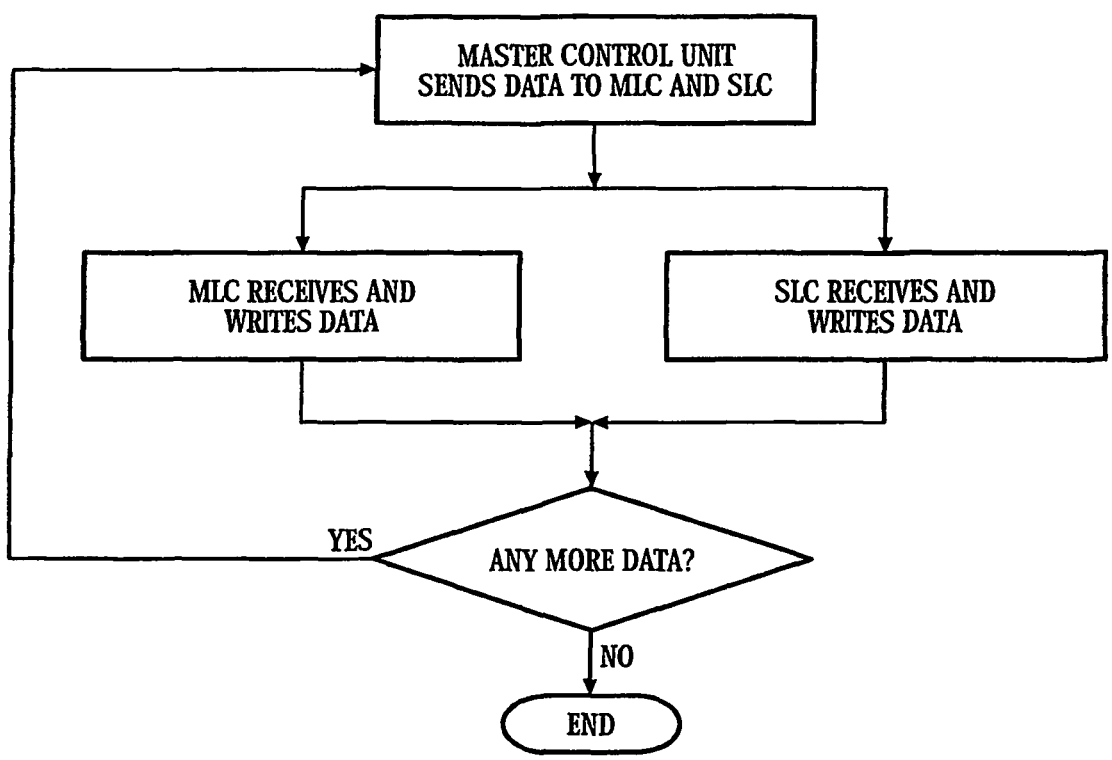
FIG. 4 is a flow chart for the operation of the second embodiment.

FIGS. 3 and 4 show a second embodiment. Common elements with the embodiment of FIGS. 1 and 2 have the same reference numerals.

Here, the SLC memory 8 and MLC memory 9 are connected via first data bus 12 and a second data bus 13 respectively. The first and second data busses may be an upper and lower data bus respectively, or vice versa. The busses 12, 13 are separate with there being a bus for each of the memories 8, 9. Both busses 12, 13 may be 8-bit data busses. ENABLE and ALE signals are able to be sent to SLC memory 8 and MLC memory 9 simultaneously. WRITE signals are also sent to both memories 8, 9 via the respective upper bus 12 or lower bus 13. The address data and data stored to the SLC memory 8 is sent via the upper bus 12, whereas the address data and data stored to the MLC memory 9 is sent via lower bus 13.

Master control unit 7 may use 16-bit data lines to control both the SLC memory 8 and the MLC memory 9, with an upper 8-bit data line being connected to upper data bus 12, and a lower 8-bit data line being connected to lower data bus 13. During a WRITE operation, the master control unit 7 will simultaneously ENABLE the SLC memory 8 and the MLC memory 9 and send data to both memories 8, 9 simultaneously on a page or block basis. As the SLC memory 8 write speed is faster than that of the MLC memory 9 the SLC memory will write more pages or blocks than the MLC memory 9 in order to obtain an average write speed between both types of memory. Again, the data is written to the memories 8, 9 at optimum speed such that the WRITE time is minimized.

The READ operation is similar to that described above in relation to FIGS. 1 and 2. The main difference is that during the READ operation on SLC memory 8, the upper bus 12 data will be read from the master control unit 7; and during the READ operation on MLC memory 9, the lower bus 13 data will be read from master control unit. During a READ operation, the master control unit 7 will simultaneously ENABLE the SLC memory 8 and the MLC memory 9 and received data from both memories 8, 9 simultaneously on a page or block basis. As the SLC memory 8 read speed is faster than that of the MLC memory 9 the SLC memory will read more pages or blocks than the MLC memory 9 in order to obtain a read speed between both types of flash. Again, the data is read by the memories 8, 9 at optimum speed such that the READ time is minimized.

By simultaneously it is meant effectively simultaneously. There may be small time differences due to processing delays but these are to be encompassed within the meaning of simultaneously.

Whilst there has been described in the foregoing description preferred embodiments of the present invention, it will be understood by those skilled in the technology concerned that many variations or modifications in details of design, construction and operation without departing from the present invention as defined in the following claims.

The invention claimed is:

1. A portable data storage device, comprising:
   (a) an interface configured to enable the portable data storage device to transfer data to and from a host computer;
   (b) an interface controller configured to control the interface; and
   (c) a master controller configured to control writing of data to and reading data from a non-volatile memory,
   (d) the non-volatile memory comprising at least one single layer cell flash memory and at least one multiple layer cell flash memory, and
   (e) the master controller being configured to operate so that the data is simultaneously written to and simultaneously read from both of the at least one single layer cell flash memory and the at least one multiple layer cell flash memory,
   wherein the data is written to and read from the at least one single layer cell flash memory at a speed a multiplication factor higher than those of the at least one multiple layer cell flash memory, and
   wherein the multiplication factor is in the range 5 to 10.

2. The portable data storage device according to claim 1, further comprising:
  at least one data bus operatively connected to the master controller and the at least one single layer cell flash memory and at least one multiple layer cell flash memory.

3. The portable data storage device according to claim 2, wherein the at least one data bus comprises a first data bus operatively connected to the at least one single layer cell flash memory and a second data bus operatively connected to the at least one multiple layer cell flash memory.

4. The portable data storage device according to claim 1, wherein the data is in the form of one of: a block, and a page.

5. The portable data storage device according to claim 4, wherein each block of data for the at least one single layer cell flash memory is 64 pages; and each block of data for the at least one multiple layer cell flash memory is 128 pages.

6. The portable data storage device according to claim 3, where the first data bus is one of: an upper data bus and a lower data bus, and the second data bus is the other of the upper data bus and the lower data bus.

7. A method of processing data on a portable data storage device, the portable data storage device comprising a master controller that controls a non-volatile memory, the memory comprising at least one single layer cell flash memory and at least one multiple layer cell flash memory, the method comprising:
  selecting, by the portable data storage device, a read operation and a write operation to transfer data between the non-volatile memory and the master controller;
  controlling, by the master controller, writing of data to and reading of data from the non-volatile memory so that the data is simultaneously written to and simultaneously read from both of the at least one single layer cell flash memory and at least one multiple layer cell flash memory,
  wherein the data is written to and read from the at least one single layer cell flash memory at a speed a multiplication factor higher than those of the at least one multiple layer cell flash memory, and
  wherein the multiplication factor is in the range 5 to 10.

8. The method according to claim 7, wherein the data is read from and written to the at least one single layer cell flash memory and the at least one multiple layer cell flash memory over at least one data bus operatively connected to the master controller and the at least one single layer cell flash memory and at least one multiple layer cell flash memory.

9. The method according to claim 8, wherein the at least one data bus comprises a first data bus operatively connected to the at least one single layer cell flash memory and a second data bus operatively connected to the at least one multiple layer cell flash memory.

10. The method according to claim 9, wherein the first data bus is one of: an upper data bus and a lower data bus, and the second data bus is the other of the upper data bus and the lower data bus.

11. The method according to claim 7,
  wherein the data is in a form of one of: a block, and a page.

12. The method according to claim 11, wherein each block of data for the at least one single layer cell flash memory is 64 pages; and each block of data for the at least one multiple layer cell flash memory is 128 pages.

* * * * *